United States Patent
Mauch et al.

(10) Patent No.: US 11,504,670 B2
(45) Date of Patent: Nov. 22, 2022

(54) APPARATUS AND METHOD FOR WET CLEANING A GAS STREAM

(71) Applicant: DAS Environmental Expert GmbH, Dresden (DE)

(72) Inventors: Hermann Mauch, Grünberg (DE); Tino Tanneberger, Dresden (DE)

(73) Assignee: DAS Environmental Expert GmbH, Dresden (DE)

( * ) Notice: Subject to any disclaimer, the term of this patent is extended or adjusted under 35 U.S.C. 154(b) by 499 days.

(21) Appl. No.: 16/660,137

(22) Filed: Oct. 22, 2019

(65) Prior Publication Data
US 2020/0139301 A1     May 7, 2020

(30) Foreign Application Priority Data
Nov. 2, 2018    (DE) .................... 10 2018 127 371.1

(51) Int. Cl.
*B01D 53/78* (2006.01)
*B01D 53/75* (2006.01)
(Continued)

(52) U.S. Cl.
CPC ............ *B01D 53/78* (2013.01); *B01D 47/06* (2013.01); *B01D 47/12* (2013.01); *B01D 47/14* (2013.01); *B01D 53/75* (2013.01); *B01D 2247/10* (2013.01); *B01D 2257/2047* (2013.01); *B01D 2257/406* (2013.01); *B01D 2257/708* (2013.01); *B01D 2258/0216* (2013.01); *H01L 21/67017* (2013.01)

(58) Field of Classification Search
None
See application file for complete search history.

(56) References Cited

U.S. PATENT DOCUMENTS 3,818,683 A * 6/1974 Hirsch .................. B01D 47/06
                                                 261/119.1
4,470,830 A * 9/1984 Aubert .................. B01D 47/06
                                                 95/224
(Continued)

FOREIGN PATENT DOCUMENTS

CN         201371039 Y     12/2009
CN         102600706 A     7/2012
(Continued)

OTHER PUBLICATIONS

Translation of KO200480334Y1, accessed Mar. 29, 2022 (Year: 2016).*

*Primary Examiner* — Christopher P Jones
*Assistant Examiner* — Phillip Y Shao
(74) *Attorney, Agent, or Firm* — Rogowski Law LLC

(57) ABSTRACT

An apparatus and method for wet cleaning a gas stream has a housing with a gas inlet and a gas outlet, wherein, in the housing, there is at least a first washing segment that serves to clean the gas stream with a washing liquid and that is arranged in the flow path of the gas stream. Inside the housing of the apparatus, there is at least one fan that regulates air pressure along the flow path of the gas stream. A bypass channel for bypassing the flow path through the at least one washing segment as well as a regulator that is arranged in the bypass and that serves to discharge the gas stream being conveyed via the bypass channel are arranged inside the housing.

18 Claims, 3 Drawing Sheets

(51) Int. Cl.
  *B01D 47/12* (2006.01)
  *B01D 47/14* (2006.01)
  *B01D 47/06* (2006.01)
  *H01L 21/67* (2006.01)

(56) References Cited

U.S. PATENT DOCUMENTS

| | | | | |
|---|---|---|---|---|
| 4,734,108 A | * | 3/1988 | Cox | B01D 50/40 |
| | | | | 204/157.3 |
| 4,948,402 A | * | 8/1990 | Davis | B01D 47/14 |
| | | | | 96/290 |
| 5,518,696 A | * | 5/1996 | Jain | B01D 53/504 |
| | | | | 422/177 |
| 6,102,990 A | * | 8/2000 | Keinanen | B01D 47/12 |
| | | | | 96/275 |
| 6,174,498 B1 | * | 1/2001 | Jain | B01D 53/68 |
| | | | | 422/123 |
| 6,726,748 B2 | * | 4/2004 | Goode | B01D 53/18 |
| | | | | 95/224 |
| 6,821,317 B2 | * | 11/2004 | Echizen | B01D 53/1412 |
| | | | | 95/224 |
| 2006/0185517 A1 | * | 8/2006 | Nagel | B01D 53/1406 |
| | | | | 96/275 |
| 2008/0271603 A1 | | 11/2008 | Triplett et al. | |
| 2017/0305774 A1 | * | 10/2017 | Knoerle | C05F 17/50 |

FOREIGN PATENT DOCUMENTS

| | | |
|---|---|---|
| CN | 203598643 U | 5/2014 |
| CN | 204469527 U | 7/2015 |
| CN | 105214421 A | 1/2016 |
| CN | 206008426 U | 3/2017 |
| DE | 29518530 U2 | 2/1996 |
| DE | 102009026175 A1 | 8/2010 |
| DE | 102015101728 A1 | 8/2016 |
| KR | 20130033876 A | 4/2013 |
| KR | KO200480334 Y1 * | 5/2016 |
| WO | 8809204 A1 | 12/1988 |
| WO | 2016124346 A1 | 8/2016 |

\* cited by examiner

APPARATUS AND METHOD FOR WET CLEANING A GAS STREAM

CROSS-REFERENCE TO RELATED APPLICATION

This application claims benefit of priority (under 35 USC § 119) to German patent application DE 102018127371.1, filed Nov. 2, 2018, the contents of which are incorporated by reference herein.

BACKGROUND OF THE INVENTION

Technical Field and State of the Art

The present invention relates to a device and a method for the wet cleaning of a gas stream.

When it comes to cleaning wafers in the semiconductor industry, as a rule, so-called wet benches are used in which carrier boxes containing several wafers are immersed into liquid baths arranged one after the other. The exhaust air of each liquid bath is fed into an exhaust-air system, a process in which a distinction is made between exhaust air containing acidic compounds, alkaline compounds, volatile organic compounds (VOC) and general exhaust air.

Likewise known are so-called single wafer wet cleaning systems which consist of several process chambers that allow several wafers to be treated separately at the same time or else that allow various process steps to be carried out in order to clean individual wafers in different chambers. During the cleaning process, the wafers are sprayed one after the other with various liquid chemicals that are then removed by spinning the wafers. Aside from ultrapure water, other typical washing liquids include ammonia solution, sulfuric acid, hydrogen peroxide, ozone-treated water, hydrofluoric acid or isopropanol. During the spraying and spinning of the wafers, the liquid either evaporates or ends up in the exhaust air channel in the form of small droplets.

Exhaust-air streams containing ammonia, hydrofluoric acid or sulfuric acid can give rise to problems in the exhaust air channel due to salt crystal formation if the vapors or droplets come into contact with each other.

These problems can be solved by means of a device of the generic type for the wet cleaning of a gas stream, a so-called wet scrubber. In principle, wet scrubbers are well-suited for removing water-soluble gases from an exhaust-air stream. Acidic and alkaline gases can be reduced to low levels by means of chemical absorption with alkaline or acidic washing liquids.

Wet scrubbers serve to remove solid, liquid or gaseous impurities from a gas, a process in which the impurities are bound to the washing liquid introduced into the gas stream and then separated out together with it.

The mode of operation of generic wet scrubbers or wet separators is such that the gases or particles from a gas stream laden with gases or particles are transferred to a liquid. For this purpose, appropriate phase interfaces between the gas and the liquid have to be formed and a relative a movement has to be created between these two phases. One method to achieve phase interfaces with the most thorough possible mixing of the gas and the liquid consists of dispersing one phase into the other. In other words, for instance, bubble swarms are generated in a liquid or drop clusters are generated in a gas, or else systems are created in which the liquid is present in the form of a more or less dispersed jet. Another fundamental way to bring gas and liquid into contact with each other consists of allowing them to circulate around liquid-wetted elements.

Therefore, the wet scrubber constitutes a simple method for cleaning exhaust air or exhaust gas, a process in which the gas to be cleaned is brought into contact with finely dispersed water drops or with some other washing liquid in a parallel current or in a counter-current, thereby cleaning the laden gas stream.

The gas scrubber functions by repeatedly mixing and separating the liquid and gaseous phases while forming phase equilibria. It is generically known that the liquid and gas phases can be conveyed in a parallel current, in a cross-current or in a counter-current, as can be gleaned, for example, from the publication of the German association of engineers (Verein Deutscher Ingenieure) VDI 3679 Blatt (Sheet) 2: 2014-07 titled "Nassabscheider; Abgasreinigung durch Absorption (Wäscher)" [Wet Separators; Waste Gas Cleaning by Absorption (Scrubbers)], published by Beuth Verlag, page 29.

When it comes to wet scrubbers for separating particles out of a gas stream, the drops that are generated are usually considerably larger than the particles that are to be separated out and consequently they can be separated out relatively easily by means of a drop or liquid separator.

Wet scrubbers can be employed directly at the place where the gases to be cleaned are formed. For this reason, wet scrubbers normally have to comply with limitations in terms of the footprint and height, that is to say, they have to be configured to be as compact as possible.

Wet scrubbers of the generic type have two washing stages that are arranged next to each other and that function on the basis of the counter-current principle. Since the transition of the gas into the liquid phase depends on the effective surface of the liquid, these washing stages are usually designed in the form of packed columns. The packed column is usually configured in the form of a packing of suitable filler material on a perforated sieve tray or else in the form of a so-called structured packing in which large blocks of a structured material are installed in the column.

Bypass lines that are installed outside of a wet scrubber are very well known in the semiconductor industry. These bypass lines allow the gas stream to be conveyed around the wet scrubber in order not to interrupt the exhaust air flow when the wet scrubber has to be opened for maintenance purposes.

The physical dimensions constitute a drawback of such systems since their size sometimes makes it difficult to transport them to their destination or installation site and/or to install them there. The above-mentioned bypass lines require additional installation space and increase the work involved in the installation.

Before the backdrop of the drawbacks described above, the invention is based on the objective of putting forward a device as well as method for the wet cleaning of a gas stream which are optimized in terms of the specific restrictions regarding size, efficiency and pressure drop.

SUMMARY OF THE INVENTION

According to a first aspect of the invention, a device for the wet cleaning of a gas stream is being put forward, comprising a housing with a gas inlet and a gas outlet. In the housing, there is at least a first washing segment that serves to clean the gas stream with a washing liquid and that is arranged in the flow path of the gas stream. Inside the housing of the device, there is at least one fan that serves to regulate the air pressure along the flow path of the gas stream.

According to the first aspect of the invention, a bypass channel for bypassing the flow path through the washing segment as well as a regulator that is arranged in the bypass and that serves to discharge the gas stream being conveyed via the bypass channel are arranged inside the housing.

In order to improve the compact size of the wet scrubber, the bypass channel is arranged inside the housing. In this manner, the total height of the device as compared to devices with a bypass located outside of the housing can be drastically reduced. For instance, this allows the total height of about 2.60 m found in prior-art systems to be reduced to a total of about 1.70 m in the device according to the invention.

The bypass channel can be arranged inside the housing in such a way that it is situated in the lower area next to the collecting tank provided for the washing liquid.

Since the bypass channel runs below the two washing segments, the exhaust air can be conveyed from the bottom to the top into the regulator and can thus open up into a connection at the upper end of the system parallel to the exhaust-air line to the two washing segments.

Owing to this design, the air can flow through the bypass channel as well as through the washing segment inside a very compact housing. In other words, the housing advantageously contains the washing segments and the bypass channel as well as the fan and the regulator for the washing segments and for the bypass channel. There is no longer a need to add external structures as is the case with prior-art wet scrubbers. This reduces not only the space requirement but also the installation time.

The exhaust-air lines leading away from the device can be connected directly to the top of the housing of the device in a space-saving manner. Due to the differing qualities of air in the device—cleaned gas stream after the washing segments and uncleaned gas stream in the bypass channel—it is advantageous to be able to connect two different venting systems. However, it is also conceivable to merge the two paths, for instance, via a Y-piece.

The at least one fan for regulating the air pressure along the flow path of the gas stream through the washing segment can be configured as an axial fan or as a radial fan. In particular, it can be provided for the air to flow from below centrally onto the horizontal impeller through an opening in the baseplate on which the fan is mounted. The impeller accelerates the air away from the axis towards the outside, as is the case with a radial fan. This allows a higher pressure to be achieved than in an axial fan. Then the air is diverted parallel to the drive axis upwards along the entire circumference around the motor of the fan.

Moreover, the channel in which the impeller is installed can be shaped so as not to be round, but rather rectangular. This translates into an optimal utilization of the space available in the system housing.

Two fans can be used in order to achieve redundancy. If the fan on the flow path through the washing segment fails, a second fan can maintain a regulated flow in the upstream process installation on the flow path through the bypass channel. Owing to the different pressure losses in the washing segment and in the bypass channel, especially different fans can be employed for the two paths through the device.

As described above, the fan for the at least one washing segment can be a radial fan whose inlet, however, can be at the bottom and its outlet can be at the top, that is to say, along a single axis. The regulator to discharge the gas stream conveyed through the bypass channel can be an axial fan. Thanks to the configuration of the two fans, it is possible to achieve a very compact construction, that is to say, the footprint and the installation space can be reduced.

According to a first advantageous embodiment of the invention, the regulator is configured as a bypass pump or as an automatically adjustable, especially regulatable, throttle valve. The use of the regulator allows a constant pressure to be maintained at the gas outlet, even in the case of a variable pressure flow. A throttle valve is preferably used when a sufficiently high negative pressure is present at the exhaust-air line that is connected to the bypass channel. The bypass pump can be used when the requisite suction capacity cannot be provided in exhaust-air systems.

According to another advantageous embodiment of the invention, a baffle element is provided for switching over the gas feed between the flow path through the bypass channel and the flow path through the at least one washing segment. The baffle element can be moved, especially swiveled, for example, by means of a drive. Moreover, the baffle element can be arranged in the vicinity of the gas inlet. The exhaust-air stream can be fed in from the side, below the first filler material packing. When the baffle element is switched over, either the flow path for the washing segment or the flow path for the bypass channel is closed on the inlet side. In this manner, just one single baffle element can open different flow paths for the gas stream.

The baffle element can be positioned below the first washing segment, so that the washing liquid trickles from the top through the at least one washing segment onto the baffle element, a process in which it is deflected into the first collecting tank for the washing liquid by the baffle element, irrespective of its position.

In contrast, in the case of the prior-art devices, for instance, the exhaust air is first fed into a chamber from which it is then conveyed either through the upper end of the chamber into the bypass or through the lower end into the wet scrubber. For this purpose, it is necessary to position valves at the upper and lower ends. The two valves have to work synchronously and for this reason, they are connected to each other via a rod. This drawback can be avoided by using the single baffle element according to the invention.

In a refinement of the invention, there are at least two washing segments in the flow path, preferably arranged one after the other. As is common practice with two-stage wet scrubbers, the two washing segments can each be connected to a collecting tank for washing liquid from which the washing liquid can be returned to the appertaining washing segment by means of a pump. Such a two-stage configuration yields considerably higher separation capacities for soluble gases than is the case with a single washing segment.

According to another embodiment, the bypass channel runs essentially below the washing segments. This configuration of the bypass channel advantageously requires only a single baffle element for purposes of switching over the air stream. In the prior-art devices, there is always a need for several valves to guide the gas stream. Moreover, the layout of the bypass channel in the lower section of the device at the height of the collecting tank provides more space at the top for the flow path of the exhaust air through the washing segments.

In another variant of the invention, the baffle element, irrespective of its position, is configured to convey the washing liquid from the first washing segment into a collecting tank. Moreover, the baffle element prevents washing liquid from flowing into the bypass channel. As mentioned, the baffle element can be situated below the first washing segment so that the washing liquid from the first washing segment is fed via the baffle element into the collecting tank. Openings for liquid can be provided below the baffle element and these are arranged in such a way that, irrespective of the position of the baffle element, there is a connection from the first washing segment to a collecting tank. These openings can end so deep below the liquid level in the collecting tank that a gas stream is prevented from passing through the openings. Thanks to this arrangement, washing liquid from the first washing segment can drain freely into the collecting tank, even when the gas stream is being conveyed through the bypass channel.

According to an advantageous refinement, the at least two washing segments are arranged in the housing side by side, with the gas stream flowing in opposite directions. Owing to the arrangement with the gas stream flowing in opposite directions, i.e. first upwards in a counter-current to the washing liquid and subsequently downwards in a parallel current, the gas stream can be conveyed from the upper end of the first washing segment directly into the upper end of the second washing segment. In contrast to an arrangement with a parallel flow direction from the bottom to the top in both washing segments, this dispenses with the need for a connecting channel and for an additional deflection, thus eliminating the pressure losses associated with this. In other words, the two washing segments can be built right next to each other. Consequently, the device requires less installation space than in the case of a gas stream with a parallel flow direction in both washing segments.

In another advantageous variant, at least one liquid separator or droplet separator is provided downstream from the washing segment. The liquid separator(s) can then be provided in the area of the deflection of the flow path through the washing segments. Downstream from the first washing segment, the gas stream flows through the liquid separator in order to prevent any entrainment of washing liquid. As a rule, a different washing liquid is used in the second washing segment. Consequently, components of the noxious gases that did not react in the first washing segment can be better absorbed in the second washing segment.

In another advantageous embodiment of the invention, the washing segments can be configured as packed columns. For this purpose, a perforated sieve tray can be provided inside the washing segments and a filler material packing that can be rinsed with washing liquid from above by means of spray nozzles is placed onto the perforated sieve tray.

In an advantageous refinement of the invention, detachable connections are provided on the device between the first and second washing segments, so that the assembled device can be broken down into at least two modules. In this manner, the device can be broken down into modules so that it can be transported and can even be installed in places with narrow access routes.

According to an autonomous idea of the invention, a method for the wet cleaning of gases is being put forward, wherein a gas stream that is to be cleaned is fed into a device for the wet cleaning of gases, wherein the gas stream flows through at least a first and a second washing segment, thus being cleaned with at least one aqueous washing liquid, and wherein a bypass channel for bypassing the flow path through the washing segments is provided and the gas stream selectively flows via the flow path through the washing segments or else via the flow path through the bypass channel.

In an advantageous embodiment of the method according to the invention, it is provided for the pressure loss to be regulated independently in both flow paths, so that pressure fluctuations at the gas inlet can be minimized when switching over between the two paths.

An advantageous variant of the method provides for a separation of liquid from the gas stream which has preferably been loaded with a liquid that serves to reduce its exhaust gas concentration.

Additional objectives, advantages, features and application possibilities of the present invention ensue from the description below of an embodiment making reference to the drawing. In this context, all of the described and/or depicted features, either on their own or in any meaningful combination, constitute the subject matter of the present invention, also irrespective of their compilation in the claims or the claims to which they refer back.

DESCRIPTION OF THE DRAWINGS

In this context, the following is shown, at times schematically.

For the sake of clarity, identical components or those having the same effect are provided with the same reference numerals in the following figures, making reference to an embodiment.

DETAILED DESCRIPTION

Figure 1:
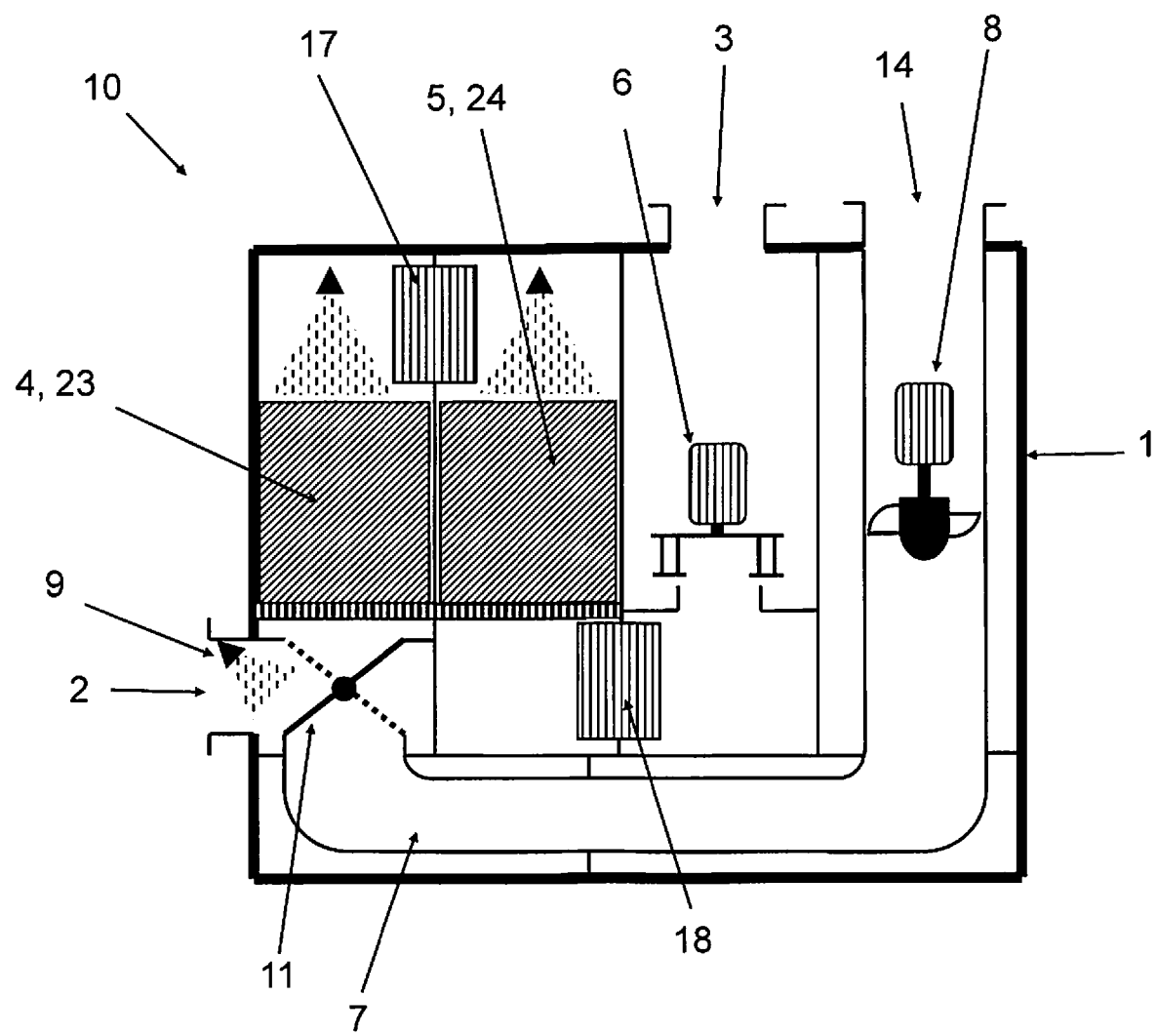
FIG. 1 a device for the wet cleaning of a gas stream, comprising two washing segments and a bypass channel.

FIG. 1 shows a device 10 for the wet cleaning of a gas stream, a so-called wet scrubber. This is a system for cleaning exhaust air from wet-chemical processes, for example, in the semiconductor industry. In this context, isopropyl alcohol (IPA), ammonia and hydrogen fluoride in the production installations have to be disposed of.

The exhaust air that is to be cleaned is fed into a cleaning segment of the device 10 via a gas inlet 2 arranged in a housing 1 of the device 10 so that the noxious gases can be removed from the exhaust air by means of chemical absorption and can then be discharged via a gas outlet 3 likewise arranged in the housing 1.

The device 10 can be equipped with a suitable adapter at the gas inlet 2 having up to twelve separate connections for feed lines. If the system is dimensioned to treat gas streams between 1000 $m^3/h$ and 4500 $m^3/h$, the footprint of the device in the present embodiment amounts to a mere 2.5 $m^2$, with a height of approximately 1.7 meters.

The gas stream containing the noxious gases can first be fed into a pre-scrubber and pre-washed by means of spray nozzles 9.

Subsequently, the gas stream reaches a first washing segment 4 arranged in the flow path 15 of the gas stream so that the gas stream can be cleaned with a washing liquid. In the present embodiment, the first washing segment 4 has a filler material packing or a packed column 23, wherein the gas stream flows through the washing segment 4 from the bottom to the top. The washing segment 4 can be supplied with a first washing liquid via additional spray nozzles 21 installed above the filler material packing 23.

As shown in FIG. 1, the first washing liquid trickles through the filler material packing 23 from the top to the bottom. The filler material packing 23 can be implemented in the form of a packing of suitable filler material placed onto a perforated sieve tray. The gas stream is fed from below through the first washing segment 4. In this manner, the large surface area of the filler material and the counter-current principle ensure an optimal absorption of the noxious gases from the gas stream.

After the gas stream has flowed through the first washing segment 4, it then flows through a droplet separator or liquid separator 17 that is located downstream from the first washing segment 4 in a first deflection area 19 in order to prevent any entrainment of washing liquid.

Subsequently, the gas stream reaches a second washing segment 5 and, as a rule, it is washed with a different washing liquid. As an alternative, the same washing liquid as that of the first washing segment 4 can be used. Therefore, components of the noxious gases that have not reacted in the first washing segment 4 can be better absorbed in the second washing segment 5. In the present embodiment, the second washing segment 5 likewise has a filler material packing 24 or a packed column that is sprayed by means of additional spray nozzles 22 for the second washing liquid. The gas stream flows through the second washing segment 5 from the top to the bottom in the same direction as the washing liquid.

After the gas stream has flowed through the second washing segment 5, it is then fed into a second liquid separator 18 that is located downstream from the second washing segment 5 in a second deflection area 20 of the device 10.

Figure 2:
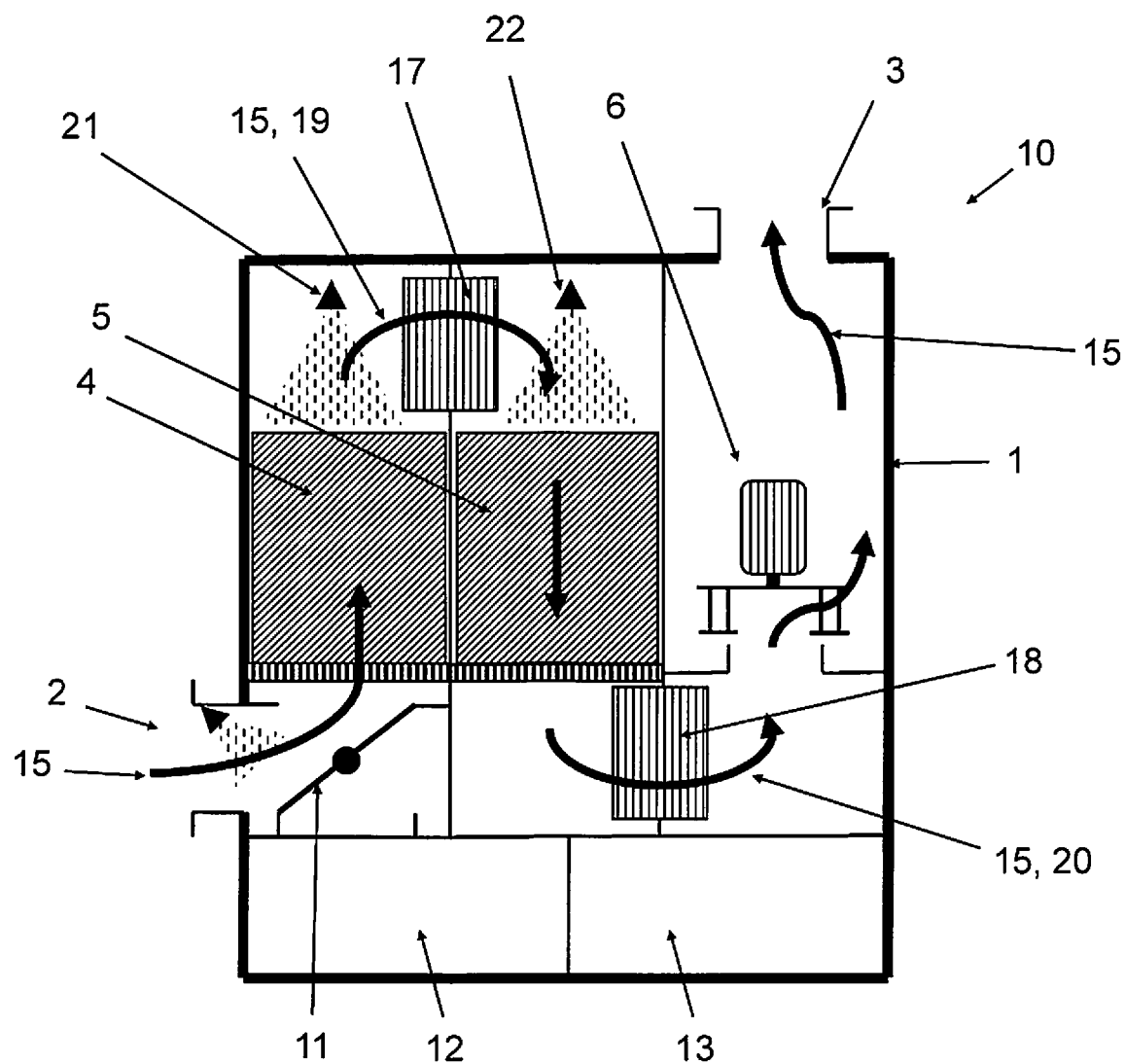
FIG. 2 a view of a first flow path of the gas stream through the washing segments.
Figure 3:
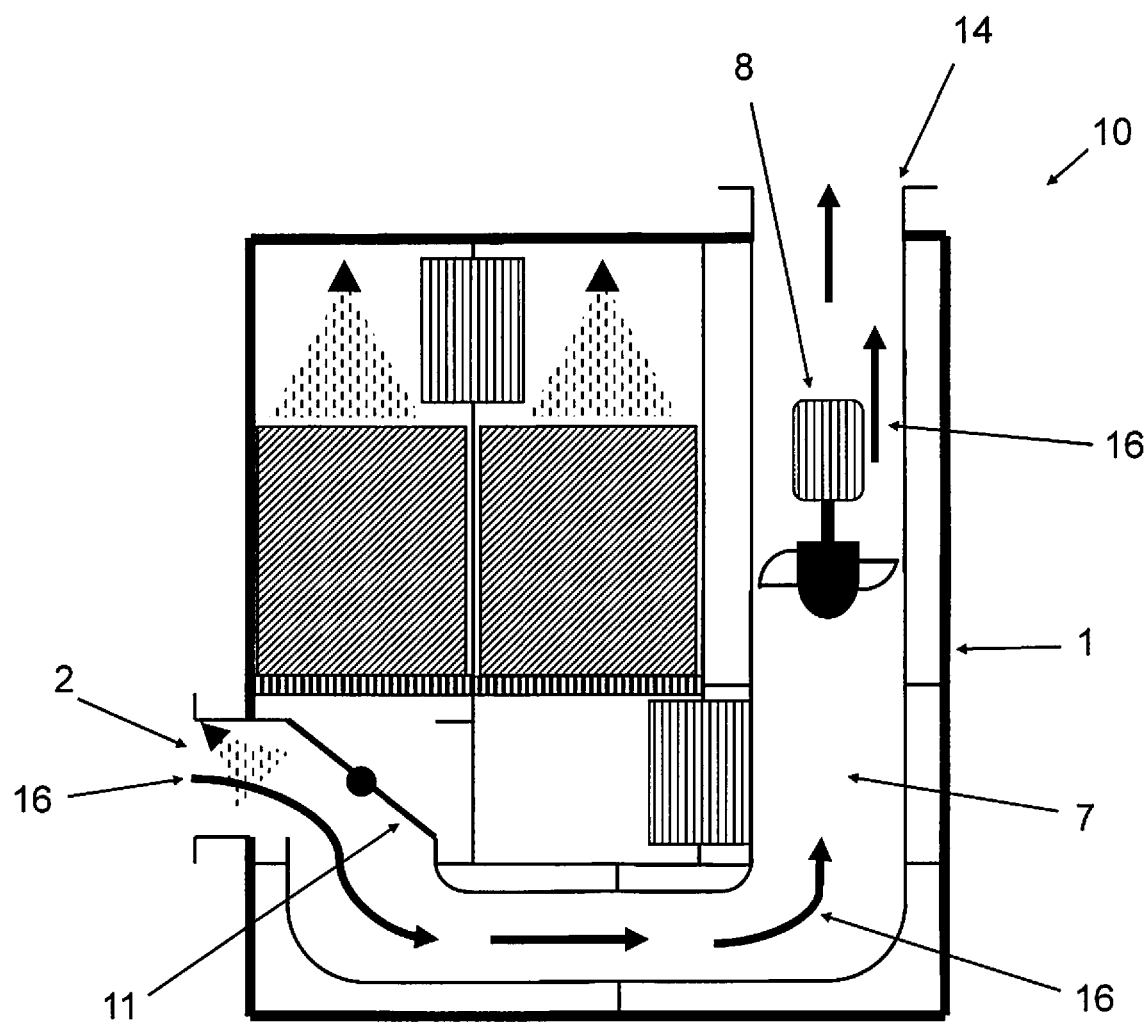
FIG. 3 a view of a second flow path of the gas stream through the bypass channel.

In the present embodiment, both washing segments 4, 5 are arranged one after the other in the flow path 15, as can be seen in FIGS. 1 to 3. Moreover, the washing segments 4, 5 are arranged in the housing 1 side by side, with the gas stream flowing in opposite directions.

In the present embodiment, in order to ensure a compact design for the device 10, the gas stream in the first washing segment 4 runs in an upwards direction in a counter-current to the washing liquid and then, in the second washing segment 5, it runs downwards in the same direction as the liquid. In this manner, a deflection found in prior-art devices can be dispensed with and both washing stages 4, 5 can be installed next to each other in a compact arrangement.

As can also be seen in FIG. 1, the device 10 has at least one fan 6 to regulate the air pressure along the flow path 15 of the gas stream inside the housing 1 of the device 10. In this manner, the system pressure is regulated and kept constant by the fan 6. The fan 6, whose frequency is preferably regulated, can achieve a pressure stability of ±10 Pa during the entire cleaning process.

The fan 6 for the at least one washing segment 4 can be a radial fan in which, however, the inlet can be at bottom and the outlet can be at the top, in other words, along a single axis. In particular, it can be provided for the gas stream to be conveyed from below centrally onto the horizontal impeller through an opening in the baseplate on which the fan is mounted. The impeller accelerates the gas away from the axis towards the outside, from where it is discharged upwards. The drive of the fan is arranged centrally in the flow channel and is surrounded by the gas stream. It can also be provided for the flow channel in which the impeller is installed to be shaped so as not be round, but rather rectangular.

Moreover, a bypass channel 7 for bypassing the flow path 15 through the washing segments 4, 5 and a regulator 8 situated in the bypass channel 7 are arranged in the housing 1 in order to discharge the gas stream that is being conveyed via the bypass channel 7. The gas stream flowing through the flow path 16 in the bypass channel 7 is discharged from the device 10 through the gas outlet 14 of the bypass channel 7.

The regulator 8 can be configured as an automatically adjustable throttle valve. In the present embodiment, the regulator is configured as a bypass pump 8.

The bypass pump 8 that serves to discharge the gas stream conveyed via the bypass channel 7 can be, for instance, an axial fan. Owing to the shape of the bypass pump 8 as well as of the fan 6, it is possible for the device 10 to have a very compact design.

Owing to the bypass channel 7, the pressure on the gas inlet side can be maintained, even, for example, during maintenance work or in the case of a failure of the device 10, so that impurities in the upstream process system caused by a standstill of the device 10 are virtually ruled out. In the case of maintenance work or a malfunction, the gas stream can bypass the two washing segments 4, 5 via the bypass channel 7.

In the present embodiment, the bypass channel 7 runs essentially below the washing segments 4, 5, so that the compact design of the device 10 is improved even further.

In the embodiment shown in FIG. 1, the gas outlet 3 for the washing segments 4, 5 and the gas outlet 14 of the bypass channel 7 are arranged next to each other in the housing 1; in particular, the fan 6 and the bypass pump 8 are arranged in adjacent channels of the device 10.

As an alternative, these channels can also be arranged one after the other in the device, as can be seen in FIGS. 2 and 3.

As can also be seen in FIGS. 1 to 3, a baffle element 11 is provided for switching the gas flow over between the flow path 16 of the gas stream through the bypass channel 7 and the flow path 15 through the at least one washing segment 4.

Moreover, the baffle element 11 can be arranged in the vicinity of the gas inlet 2. The gas stream can be fed in from the side, below the first filler material packing 23.

The baffle element 11 is configured so that, irrespective of its position, it conveys the washing liquid of the first washing segment 4 into a collecting tank 12 for the first washing liquid. Furthermore, a second collecting tank 13 can be provided for the second washing liquid. It is also conceivable for the first and second washing liquids to be fed into a single collecting tank 12, 13.

The baffle element 11 can be moved by means of a drive (not shown here) between the bypass position and the position for the washing segments 4, 5.

FIG. 1 shows the baffle element 11 with a solid line in a position in which the gas stream is being conveyed through the washing segments 4, 5. The dash-dot line of the baffle element 11 in FIG. 1 illustrates the bypass channel position of the baffle element 11.

The arrows in FIG. 2 show the flow path of the gas stream through the washing segments 4, 5. The baffle element 11 is in a position in which the gas stream that is flowing into the gas inlet 2 is conveyed into the first washing segment 4. As already elaborated upon above, the gas stream then flows through the liquid separator 17 situated in the first deflection area 19 and enters the second washing segment 5. Subsequently, the gas stream flows through the second liquid separator 18 and is discharged from the device 10 via the fan 6 through the gas outlet 3.

The bypass channel 7 is not shown in the depiction of the device 10 in FIG. 2 since it would obstruct the view of the outlet channel with the gas outlet 3 and the two collecting tanks 12, 13.

The flow path 16 of the gas stream through the bypass channel 7 is indicated by the arrows in FIG. 3. In this case as well, the gas stream enters the device 10 via the gas inlet 2 and then, as a function of the position of the baffle element 11, it is not conveyed into the first washing segment 4 but rather into the bypass channel 7, in other words, it flows around the washing segments 4, 5. The gas stream is then discharged from the device 10 via the gas outlet 14 of the bypass channel 7. The regulator 8 supplies the pressure needed for the gas stream to flow through the bypass channel 7.

The collecting tanks 12, 13 of the fan 6 and of the gas outlet 3 are not depicted in FIG. 3 because they are situated behind the bypass channel 7.

Detachable connections can be provided on the device 10 between the first washing segment 4 and the second washing segment 5 so that the assembled device 10 can be broken down into at least two modules. In this manner, the components can be pre-assembled, which allows simple transportation as well as quick assembly of the device 10 at the installation site.

Thanks to this device, air can be conveyed through the bypass channel 7 as well as through the washing segments 4, 5 inside a compact housing 1. There is no longer a need for external structures as is the case in prior-art devices for the wet cleaning of gas streams. This reduces not only the installation space but also the installation time.

It will be appreciated by those skilled in the art that changes could be made to the embodiments described above without departing from the broad inventive concept thereof. It is understood, therefore, that this disclosure is not limited to the particular embodiments disclosed, but it is intended to cover modifications within the spirit and scope of the present disclosure as defined by the appended claims.

LIST OF REFERENCE NUMERALS 1 housing
2 gas inlet
3 gas outlet
4 first washing segment
5 second washing segment
6 fan
7 bypass channel
8 regulator
9 spray nozzle
10 device
11 baffle element
12 collecting tank for the first washing liquid
13 collecting tank for the second washing liquid
14 gas outlet of the bypass channel
15 flow path of the washing segment
16 flow path of the bypass channel
17 liquid separator
18 liquid separator
19 deflection area
20 deflection area
21 spray nozzles for the first washing liquid
22 spray nozzles for the second washing liquid
23 filler material packing
24 filler material packing

The invention claimed is:

1. A device (10) for wet cleaning a gas stream, comprising:
a housing (1) with a gas inlet (2) and a gas outlet (3);
at least one washing segment (4) inside the housing (1) configured to clean the gas stream with a washing liquid, said at least one washing segment (4) being arranged in a flow path (15) of the gas stream;
at least one fan (6) inside the housing (1) configured to regulate air pressure along the flow path (15) of the gas stream;
a bypass channel (7) inside the housing (1) for bypassing the flow path (15) through the at least one washing segment (4);
a baffle element (11) inside the housing (1), the baffle element (11) configured to switch over a gas feed between the flow path (15) through the at least one washing segment (4) and a second flow path (16) through the bypass channel (7); and
a regulator (8) arranged in the bypass channel (7) and configured to maintain gas pressure and discharge the gas stream being conveyed along the second flow path (16) via the bypass channel (7).

2. The device (10) according to claim 1, characterized in that the regulator (8) is configured as a bypass pump.

3. The device (10) according to claim 1, wherein at least two washing segments (4, 5) are arranged in the flow path (15) of the gas stream in series one after the other.

4. The device (10) according to claim 3, wherein the bypass channel (7) runs substantially below the at least two washing segments (4, 5).

5. The device (10) according to claim 1, characterized in that the baffle element (11), irrespective of its position, is configured to convey the washing liquid from the first washing segment (4) into a collecting tank (12).

6. The device (10) according to claim 3, characterized in that the at least two washing segments (4, 5) are arranged in the housing (1) side by side, with the gas stream (15) flowing in a first direction through a first (4) of the at least two washing segments and flowing in an opposite direction through a second (5) of the at least two washing segments.

7. The device (10) according to claim 3, further comprising at least one liquid separator (17, 18) arranged downstream from the at least two washing segments (4, 5).

8. The device (10) according to claim 7, characterized in that the at least one liquid separator (17, 18) is provided in an area of the deflection (19, 20) of the flow path (15) through the at least two washing segments (4, 5).

9. The device (10) according to claim 3, further comprising a packed column (23, 24) associated with each of the at least two washing segments (4, 5).

10. The device (10) according to claim 3, further comprising detachable connections between a first washing segment (4) and a second washing segment (5) of the at least two washing segments (4,5), so that the device (10) is adapted for breaking apart to form at least two modules.

11. A method for wet cleaning a gas stream, comprising:
(i) feeding the gas stream that is to be cleaned into a device (10) for wet cleaning gases, said device (10) having a housing (1) with a gas inlet (2) and a gas outlet (3), at least two washing segments (4, 5) inside the housing (1) configured to clean the gas stream with a washing liquid, said first and second washing segments (4, 5) being arranged in a flow path (15) of the gas stream, at least one fan (6) inside the housing (1) configured to regulate air pressure along the flow path (15) of the gas stream, and a bypass channel (7) inside the housing (1) for bypassing the flow path (15) through the at least two washing segments (4, 5) and a regulator (8), with said regulator (8) being arranged in the bypass channel (7) and configured to maintain gas pressure and discharge the gas stream being conveyed via the bypass channel (7),
(ii) selectively switching the gas stream flow path to cause the gas stream to flow either (a) through at least a first washing segment (4) of the at least two washing segments and a second washing segment (5) of the at least two washing segments, to clean the gas stream with at least one aqueous washing liquid, or (b) through the bypass channel (7) for bypassing the flow path (15) through the at least two washing segments (4, 5) and in a flow path (16) through the bypass channel (7).

12. The method according to claim 11, characterized in that pressure loss is regulated independently in the flow path (15) and the second flow path (16), so that pressure fluctuations at the gas inlet (2) are minimized when switching between the flow path (15) and the second flow path (16).

13. The method according to claim 11, further comprising (iii) separating out from the gas stream a liquid that was loaded into the gas stream in order to reduce exhaust gas concentration.

14. An apparatus for wet cleaning a gas stream, comprising:
- a housing with a gas inlet and at least two gas outlets and defining a first flow path of the gas stream and a second flow path of the gas stream;
- at least one washing segment in the housing adapted to clean the gas stream with a washing liquid, said at least one washing segment being arranged in the first flow path of the gas stream;
- at least one fan inside the housing adapted to regulate air pressure along the first flow path of the gas stream;
- a bypass channel in the housing defining the second flow path, said second flow path bypassing the first flow path through the at least one washing segment;
- a baffle element adapted to switch over a gas feed between the second flow path through the bypass channel and the first flow path through the at least one washing segment; and
- a regulator installed in the bypass channel and adapted to discharge the gas stream being conveyed via the bypass channel and to maintain gas pressure of the gas stream in the bypass channel.

15. The apparatus of claim 14, further comprising a second washing segment arranged in the first flow path in series with the first washing segment.

16. The apparatus of claim 14, further comprising a second washing segment in the housing and arranged side by side with the first washing segment.

17. The apparatus of claim 15, further comprising at least one liquid separator arranged in the first flow path downstream from the first washing segment and in an area of deflection of the first flow path between the first washing segment and the second washing segment.

18. The apparatus of claim 14, wherein the regulator is a bypass pump.

* * * * *